(12) United States Patent
Konno (10) Patent No.: US 8,796,711 B2
(45) Date of Patent: Aug. 5, 2014

(54) LIGHT-EMITTING ELEMENT

(75) Inventor: Taichiroo Konno, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 3 days.

(21) Appl. No.: 13/137,690

(22) Filed: Sep. 2, 2011

(65) Prior Publication Data

US 2012/0086030 A1  Apr. 12, 2012

(30) Foreign Application Priority Data

Oct. 12, 2010  (JP) ................................. 2010-229704

(51) Int. Cl.
*H01L 33/10*  (2010.01)

(52) U.S. Cl.
USPC ............... 257/98; 257/E33.005; 257/E33.068

(58) Field of Classification Search
CPC ........................................................ H01L 33/10
USPC ............................ 257/98, E33.005, E33.068
See application file for complete search history.

(56) References Cited

U.S. PATENT DOCUMENTS

| | | | |
|---|---|---|---|
| 5,260,589 A | 11/1993 | Yamauchi et al. | |
| 5,635,733 A | 6/1997 | Okagawa et al. | |
| 5,744,829 A * | 4/1998 | Murasato et al. | 257/94 |
| 7,569,866 B2 | 8/2009 | Konno et al. | |
| 8,212,268 B2 * | 7/2012 | Konno | 257/95 |
| 8,258,529 B2 * | 9/2012 | Konno et al. | 257/98 |
| 8,350,277 B2 * | 1/2013 | Konno | 257/95 |
| 2010/0084670 A1 * | 4/2010 | Cheng et al. | 257/98 |
| 2010/0327298 A1 * | 12/2010 | Konno et al. | 257/94 |

FOREIGN PATENT DOCUMENTS

| | | |
|---|---|---|
| JP | 5-37017 A | 2/1993 |
| JP | 8-228022 A | 9/1996 |
| JP | 2002-280606 A | 9/2002 |

(Continued)

OTHER PUBLICATIONS

Japanese Notification of Reason(s) for Refusal dated Aug. 20, 2013.

*Primary Examiner* — Yu Chen
(74) *Attorney, Agent, or Firm* — McGinn IP Law Group, PLLC

(57) ABSTRACT

A light-emitting element includes a semiconductor substrate, a light emitting portion including an active layer, a reflective portion between the semiconductor substrate and the light emitting portion, and a current dispersion layer on the light emitting portion. The reflective portion includes a plurality of pair layers each including a first semiconductor layer and a second semiconductor layer. The first semiconductor layer has a thickness $T_{A1}$ defined by a formula (1) and the second semiconductor layer has a thickness $T_{B1}$ defined by a formula (2), where $\lambda_P$ represents a peak wavelength of the light emitted from the active layer, $n_A$ represents a refractive index of the first semiconductor layer, $n_B$ represents a refractive index of the second semiconductor layer, $n_{In}$ represents a refractive index of a first cladding layer, and $\theta$ represents an incident angle of light from the first cladding layer to the second semiconductor layer.

$$T_{A1} = \frac{\lambda_p}{4n_A \sqrt{1 - \left(\frac{n_{In}\sin\theta}{n_A}\right)^2}} \quad \text{Formula (1)}$$

$$T_{B1} = \frac{\lambda_p}{4n_B \sqrt{1 - \left(\frac{n_{In}\sin\theta}{n_B}\right)^2}} \quad \text{Formula (2)}$$

17 Claims, 7 Drawing Sheets

(56) References Cited

FOREIGN PATENT DOCUMENTS

| JP | 2004-356221 A | 12/2004 |
| JP | 2005-136033 A | 5/2005 |
| JP | 2006-40998 A | 2/2006 |
| JP | 2007-96162 A | 4/2007 |

\* cited by examiner

LIGHT-EMITTING ELEMENT

The present application is based on Japanese Patent Application No. 2010-229704 filed on Oct. 12, 2010, the entire contents of which are incorporated herein by reference.

BACKGROUND OF THE INVENTION

1. Field of the Invention

The invention relates to a light-emitting element and, in particular, to a light-emitting element including a semiconductor substrate opaque (or not transparent) to light emitted from a light emitting portion, and a reflective portion formed between the semiconductor substrate and the light emitting portion.

2. Description of the Related Art

A conventional light-emitting element is known which includes an n-type GaAs substrate, a light reflection layer formed on the n-type GaAs substrate, an n-type $Al_{0.45}Ga_{0.55}As$ cladding layer formed on the light reflection layer, a p-type GaAs active layer formed on the n-type $Al_{0.45}Ga_{0.55}As$ cladding layer, a p-type $Al_{0.45}Ga_{0.55}As$ cladding layer formed on the p-type GaAs active layer and a p-type GaAs cap layer formed on the p-type $Al_{0.45}Ga_{0.55}As$ cladding layer, and in which the light reflection layer has a laminated structure of n-type AlAs/n-type $Al_xGa_{1-x}As$, the laminated structure is formed in a chirp shape with continuously varied film thickness, and a relation among a variable thickness ratio, the number of laminated layers and a mix crystal ratio is defined to obtain a predetermined reflection wavelength band and a reflectance (see, e.g., JP-A-5-37017).

Since the light reflection layer of the light-emitting element disclosed in JP-A 5-37017 reflects light traveling toward a semiconductor substrate side by optical interference, it is possible to improve the optical output.

SUMMARY OF THE INVENTION

Although the light-emitting element disclosed in JP-A-5-37017 is operable to expand a reflection wavelength region by the single light reflection layer, it is difficult to improve the light output of the light-emitting element without increasing the film thickness of the light reflection layer. Also, besides light (hereinafter referred to as "first emission light") in a wavelength region equivalent to a bandgap of the active layer, light in a wavelength region equivalent to a bandgap of GaAs, i.e., infrared light (hereinafter referred to as "second emission light") may be emitted from the light-emitting element disclosed in JP-A-5-37017. This occurs because the first emission light emitted from the active layer is partially incident on a GaAs substrate or a buffer layer formed of GaAs, and the GaAs substrate or the buffer layer is photoexcited by the first emission light. That is, in the light-emitting element using a GaAs substrate or a buffer layer formed of GaAs, the second emission light may be emitted from the GaAs substrate or the buffer layer which is photoexcited by the first emission light. When a light-emitting element which emits second emission light is used, a general semiconductor photodiode may malfunction due to the second emission light emitted from the light-emitting element, and it is not suitable for use on, e.g., a scanner.

Accordingly, it is an object of the invention to provide a light-emitting element that has a high light output and is reduced in emission of unnecessary wavelength light without significantly increasing the manufacturing cost.

(1) According to one embodiment of the invention, a light-emitting element comprises:
 a semiconductor substrate;
 a light emitting portion comprising an active layer sandwiched between a first cladding layer of a first conductivity type and a second cladding layer of a second conductivity type different from the first conductivity type;
 a reflective portion between the semiconductor substrate and the light emitting portion for reflecting light emitted from the active layer; and
 a current dispersion layer on an opposite side of the light emitting portion from the reflective portion;
 wherein the reflective portion comprises a plurality of pair layers each including a first semiconductor layer and a second semiconductor layer different from the first semiconductor layer,
 the first semiconductor layer has a thickness $T_{A1}$ defined by a formula (1) and the second semiconductor layer has a thickness $T_{B1}$ defined by a formula (2), where $\lambda_P$ represents a peak wavelength of the light emitted from the active layer, $n_A$ represents a refractive index of the first semiconductor layer, $n_B$ represents a refractive index of the second semiconductor layer, $n_{In}$ represents a refractive index of the first cladding layer, and $\theta$ represents an incident angle of light from the first cladding layer to the second semiconductor layer,
 the plurality of pair layers each comprise the first semiconductor layer and the second semiconductor layer with the thickness defined by the formula (1) and the formula (2), respectively, using the $\theta$ in a range of not less than 44 and not more than 61, and
 a value of the $\theta$ is different from each other among the plurality of pair layers.

$$T_{A1} = \frac{\lambda_P}{4n_A\sqrt{1-\left(\frac{n_{In}\sin\theta}{n_A}\right)^2}} \quad \text{Formula (1)}$$

$$T_{B1} = \frac{\lambda_P}{4n_B\sqrt{1-\left(\frac{n_{In}\sin\theta}{n_B}\right)^2}} \quad \text{Formula (2)}$$

In the above embodiment (1) of the invention, the following modifications and changes can be made.
(i) The light-emitting element further comprises:
 an intermediate layer between the second cladding layer and the current dispersion layer,
 wherein the intermediate layer comprises a semiconductor having a bandgap energy between a bandgap energy of a semiconductor composing the second cladding layer and a bandgap energy of a semiconductor composing the current dispersion layer.
(ii) The plurality of pair layers each comprise the first semiconductor layer having the thickness $T_{A1}$ that is not less than 1.5 times of $\lambda_P/4n_A$ and the second semiconductor layer having the thickness $T_{B1}$ that is not less than 1.5 times of $\lambda_P/4n_B$.
(iii) The light-emitting element further comprises:
 a second reflective portion between the reflective portion and the semiconductor substrate,
 wherein the second reflective portion comprises a plurality of pair layers each including a third semiconductor layer and a fourth semiconductor layer different from the third semiconductor layer,
 the third semiconductor layer has a thickness $T_C$ defined by the formula (3) where $\lambda_{P2}$ is 870±30 nm and $n_C$ represents a refractive index of the third semiconductor layer, and the fourth semiconductor layer has a thickness $T_D$ defined by the formula (4) where $n_D$ represents a refractive index of the fourth semiconductor layer.

$$T_C = \frac{\lambda_{p2}}{4n_C} \quad \text{Formula (3)}$$

$$T_D = \frac{\lambda_{p2}}{4n_D} \quad \text{Formula (4)}$$

(iv) The reflective portion and the second reflective portion have a bandgap more than that of a semiconductor composing the active layer and comprises $Al_xGa_{1-x}As$ (0≤x≤1) that is transparent to light emitted from the active layer.
(v) The first semiconductor layer and the second semiconductor layer comprise $Al_xGa_{1-x}As$ (0≤x≤1) having a refractive index different from each other or $(Al_yGa_{1-y})_zIn_{1-z}P$ (0≤y≤1 and 0.4≤z≤0.6) having a refractive index different from each other, and
the third semiconductor layer and the fourth semiconductor layer comprise $Al_xGa_{1-x}As$ (0≤x≤1) having a refractive index different from each other or $(Al_yGa_{1-y})_zIn_{1-z}P$ (0≤y≤1 and 0.4≤z≤0.6) having a refractive index different from each other.
(vi) The current dispersion layer comprises a plurality of current dispersion layers, and
a current dispersion layer of the plurality of current dispersion layers on an opposite side from the semiconductor substrate has a highest impurity concentration determining a carrier concentration and a conductivity type.
(vii) The light-emitting element further comprises:
a front surface electrode on a surface of the current dispersion layer on an opposite side from the light emitting portion;
a concavo-convex portion formed in a region on the surface of the current dispersion layer except a region on which the front surface electrode is formed; and
a light extracting layer formed on a surface of the concavo-convex portion, being transparent to the light emitted from the active layer and comprising a material having a refractive index between a refractive index of a semiconductor composing the current dispersion layer and that of the air.
(viii) The light extracting layer has a thickness d within a range of ±30% of a value defined by $A+\lambda_P/(4 \times n)$ where $\lambda_P$ represents a wavelength of the light emitted from the active layer, n represents a refractive index of a material constituting the light extracting layer, and A is a constant and an odd number.
(ix) The light extracting layer comprises an insulator, an oxide of the first or second conductivity type, or a nitride of the first or second conductivity type.

Points of the Invention

According to one embodiment of the invention, a light-emitting element is constructed such that a reflective portion thereof has both the function of reflecting light emitted from an active layer thereof and the function of reflecting a second emission light excited by light emitted from the active layer. Thereby, it is possible to suppress light having an unnecessary wavelength outwardly emitted from the light-emitting element. In addition, the light-emitting element need not separately provide a semiconductor layer having the function of reflecting the second emission light. Thus, it is possible to increase the light output without significantly increasing the manufacturing cost.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Figure 1A:
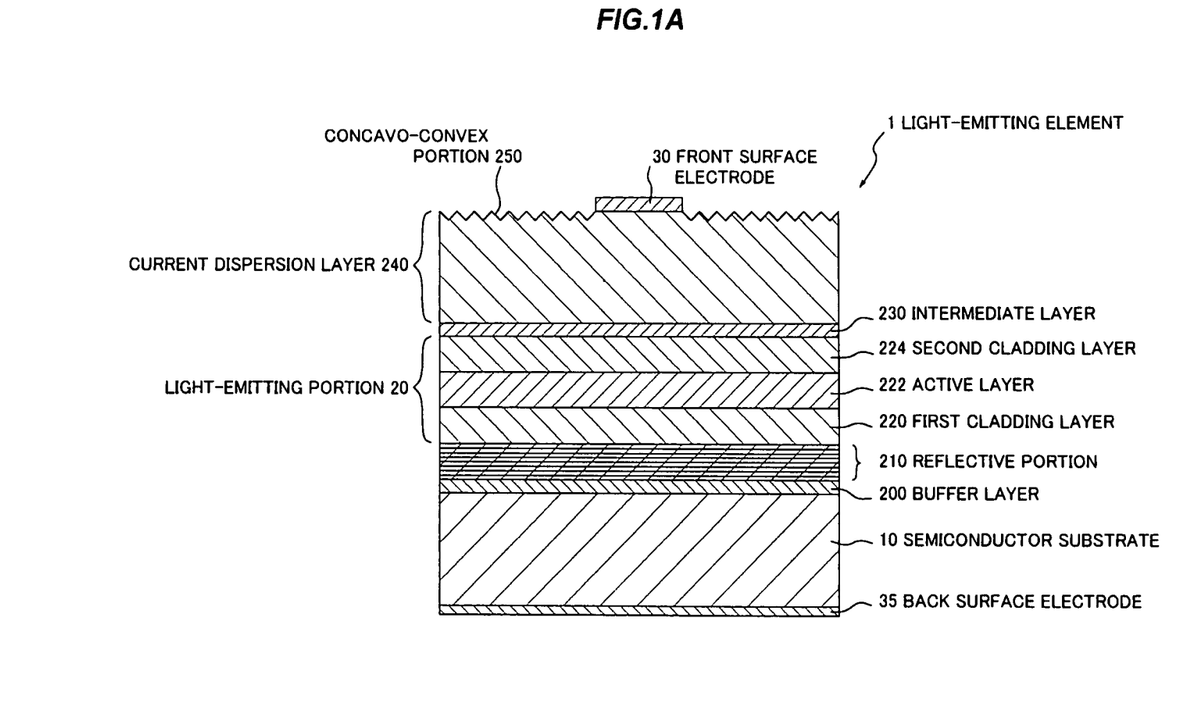
FIG. 1A is a schematic cross sectional view showing a light-emitting element in a first preferred embodiment of the present invention.
Figure 1B:
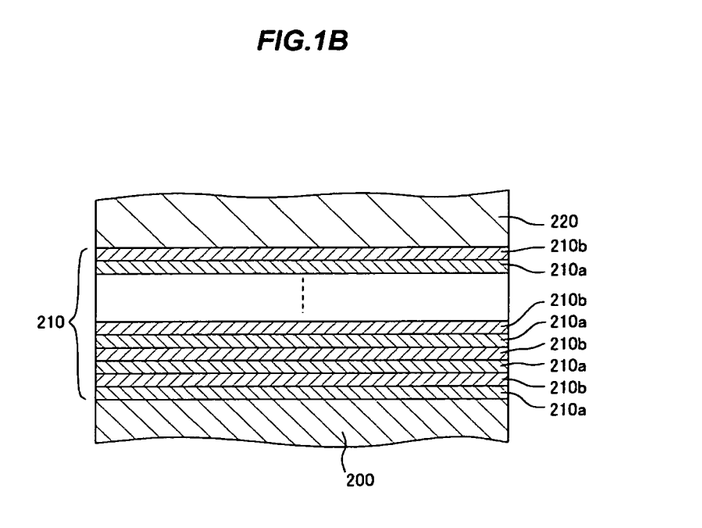
FIG. 1B is a schematic cross sectional view showing a reflective portion included in the light-emitting element in the first embodiment of the invention.

FIG. 1A is a schematic cross sectional view showing a light-emitting element in a first embodiment of the invention and FIG. 1B is a schematic cross sectional view showing a reflective portion included in the light-emitting element in the first embodiment of the invention.

Structural Overview of Light-Emitting Element 1

A light-emitting element 1 in the first embodiment is, as an example, a light emitting diode (LED) as a semiconductor light emitting element which emits orange light. In detail, the light-emitting element 1 is provided with a semiconductor substrate 10 of n-type as a first conductivity type, an n-type buffer layer 200 formed on the semiconductor substrate 10, a reflective portion 210 formed on the buffer layer 200 so as to have a multilayer structure of n-type compound semiconductors, an n-type first cladding layer 220 formed on the reflective portion 210, an active layer 222 formed on the first cladding layer 220, a second cladding layer 224 of p-type as a second conductivity type different from the first conductivity type formed on the active layer 222, a p-type intermediate layer 230 formed on the second cladding layer 224, and a p-type current dispersion layer 240 formed on the intermediate layer 230.

In addition, on a surface of the current dispersion layer 240 opposite to the intermediate layer 230 (i.e., on a light extracting surface), the current dispersion layer 240 has a concavo-convex portion 250 for reducing light reflection on the light extracting surface. Meanwhile, the active layer 222 is sandwiched between the first cladding layer 220 and the second cladding layer 224, and in the following explanation, the first cladding layer 220, the active layer 222 and the second cladding layer 224 are sometimes collectively called a light emitting portion 20.

In addition, the light-emitting element 1 is further provided with a front surface electrode 30 provide on a portion of the surface of the current dispersion layer 240, i.e., in a region different from the region in which the concavo-convex portion 250 is provided, and a back surface electrode 35 formed on the semiconductor substrate 10 opposite to the reflective portion 210. Alternatively, the front surface electrode 30 may be configured to have a laminated structure including plural surface electrode layers. The front surface electrode 30 can be composed of, e.g., a first surface electrode layer formed in contact with the current dispersion layer 240, a second surface electrode layer formed on the first surface electrode layer and the third surface electrode layer formed on the second surface electrode layer.

Semiconductor Substrate 10

As the semiconductor substrate 10, it is possible to use, e.g., a GaAs substrate including a carrier of a predetermined conductivity type and having a carrier concentration within a predetermined range. In addition, a miss oriented substrate with a predetermined off-angle or a just substrate without off-angle can be used for the semiconductor substrate 10. Alternatively, a compound semiconductor material constituting the semiconductor substrate 10 can be appropriately changed according to types of plural compound semiconductor layers to be formed on the semiconductor substrate 10.

Reflective Portion 210

The reflective portion 210 is formed between the semiconductor substrate 10 and the light emitting portion 20, and reflects the light emitted from the active layer 222. In detail, as shown in FIG. 1B, the reflective portion 210 is formed having a laminated structure of plural compound semiconductor layers. Then, the reflective portion 210 is formed having plural pair layers each composed of a first semiconductor layer 210a and a second semiconductor layer 210b having a refractive index different from that of the first semiconductor layer 210a. In the first embodiment, the reflective portion 210 is formed having not less than 15 pair layers. Here, it is preferable that the reflective portion 210 have a thickness of about not more than 8 μm for the purpose of suppressing a decrease in a light reflecting function and an increase in the manufacturing cost of the light-emitting element 1.

The first semiconductor layer 210a and the second semiconductor layer 210b are transparent to the light emitted from the active layer 222, and are formed of an AlGaAs-based semiconductor having a greater bandgap than that of the semiconductor constituting the active layer 222. That is, the first semiconductor layer 210a and the second semiconductor layer 210b are formed of $Al_xGa_{1-x}As$ ($0 \leq x \leq 1$) having refractive indexes different from each other. In addition, the first semiconductor layer 210a and the second semiconductor layer 210b are formed so that an Al composition of the semiconductor constituting the first semiconductor layer 210a is different from that of the semiconductor constituting the second semiconductor layer 210b.

Alternatively, the first semiconductor layer 210a and the second semiconductor layer 210b can be formed of $(Al_yGa_{1-y})_zIn_{1-z}P$ ($0 \leq y \leq 1$ and $0.4 \leq z \leq 0.6$) having refractive indexes different from each other. It is possible to form, e.g., the first semiconductor layer 210a from $(Al_yGa_{1-y})_zIn_{1-z}P$ ($0 \leq y \leq 1$ and $0.4 \leq z \leq 0.6$) having a first refractive index and the second semiconductor layer 210b from $(Al_yGa_{1-y})_zIn_{1-z}P$ ($0 \leq y \leq 1$ and $0.4 \leq z \leq 0.6$) having a second refractive index which is different from the first refractive index.

Alternatively, it is possible to form the first semiconductor layer 210a from $(Al_yGa_{1-y})_zIn_{1-z}P$ ($0 \leq y \leq 1$ and $0.4 \leq z \leq 0.6$) having a first refractive index and the second semiconductor layer 210b from $Al_xGa_{1-x}As$ ($0 \leq x \leq 1$) having a second refractive index which is different from the first refractive index. Furthermore, it is possible to form the first semiconductor layer 210a from $Al_xGa_{1-x}As$ ($0 \leq x \leq 1$) having a first refractive index and the second semiconductor layer 210b from $(Al_yGa_{1-y})_zIn_{1-z}P$ ($0 \leq y \leq 1$ and $0.4 \leq z \leq 0.6$) having a second refractive index which is different from the first refractive index.

Although the first semiconductor layer 210a and the second semiconductor layer 210b can be formed having thicknesses according to an incident angle of light as described below, the thicknesses thereof shown in FIG. 1B are substantially the same for convenience of explanation.

Here, the plural pair layers of the reflective portion 210 each reflect light with a wavelength greater than an emission peak wavelength of the light emitted from the active layer 222, and respectively reflect light from different incident angles. In detail, when a peak wavelength of the light emitted from the active layer 222 is defined as $\lambda_P$, a refractive index of the first semiconductor layer 210a is defined as $n_A$, a refractive index of the second semiconductor layer 210b is defined as $n_B$, a refractive index of the first cladding layer 220 is defined as $n_{In}$, and an incident angle of light from the first cladding layer 220 to the first semiconductor layer 210b is θ (θ is an angle with respect to a normal line of incident plane where the principal surface of the second semiconductor layer 210b is the incident plane of light), the first semiconductor layer 210a is formed having a thickness $T_{A1}$ defined by the following formula (1). Meanwhile, the second semiconductor layer 210b is formed having a thickness $T_{B1}$ defined by the following formula (2).

$$T_{A1} = \frac{\lambda_P}{4n_A\sqrt{1 - \left(\frac{n_{In}\sin\theta}{n_A}\right)^2}} \quad \text{Formula (1)}$$

$$T_{B1} = \frac{\lambda_P}{4n_B\sqrt{1 - \left(\frac{n_{In}\sin\theta}{n_B}\right)^2}} \quad \text{Formula (2)}$$

The first semiconductor layer 210a included in one pair layer of the plural pair layers is formed having a thickness calculated by the formula (1) based on the incident angle θ of the light incident on the one pair layer. Likewise, the second semiconductor layer 210b included in the one pair layer is formed having a thickness calculated by the formula (2) based on the incident angle θ. Other pair layers included in the plural pair layers are also formed including the first semiconductor layer 210a and the second semiconductor layer 210b which have thicknesses in accordance with the incident angle θ of the light incident on the other pair layers in the same manner.

Furthermore, in the first embodiment, the reflective portion 210 includes the first semiconductor layer 210a and the second semiconductor layer 210b with thicknesses respectively defined by the formulas (1) and (2) applying a value of θ within a range from 44 to 61. That is, the reflective portion 210 includes at least one pair layer composed of the first semiconductor layer 210a and the second semiconductor layer 210b with thicknesses respectively defined by the formulas (1) and (2) applying a value of θ within a range from 44 to 61. In addition, the reflective portion 210 includes at least one pair layer composed of the first semiconductor layer 210a with a thickness defined by the formula (1) applying a value of θ within a range from 44 to 61 and the second semiconductor layer 210b with a thickness defined by the formula (2) applying a value of θ within a range from 44 to 61.

Since the value of θ in the formulas (1) and (2) is different for each pair layer, the plural pair layers are formed having thicknesses different from each other. For example, a thickness of one pair layer is different from that of another pair layer. When the value of θ in one pair layer is defined as $θ_a$ and that in another pair layer is defined as $θ_b$, the thickness of the first semiconductor layer 210a and that of the second semiconductor layer 210b included in the one pair layer are calculated by the formulas (1) and (2) using the value $θ_a$, and the thickness of the first semiconductor layer 210a and that of the second semiconductor layer 210b included in the other pair layer are calculated by the formulas (1) and (2) using the value $\theta_b$ which is different from $\theta_a$. Note that, the pair layer may include the first semiconductor layer 210a having the thickness $T_{A1}$ which is not less than 1.5 times and not more than twice of $\lambda_P/4n_A$ and the second semiconductor layer 210b having the thickness $T_{B1}$ which is not less than 1.5 times and not more than twice of $\lambda_P/4n_B$.

As described above, the reflective portion 210 in the first embodiment has the first semiconductor layer 210a and the second semiconductor layer 210b which have thicknesses defined by the formulas (1) and (2) using the value of $\theta$ from 44 to 61. As a result, when the light-emitting element 1 emitting light with an emission peak wavelength from 570 to 650 nm (i.e., the first emission light) is manufactured, the second emission light generated by photoexcitation caused by incidence of the first emission light on a GaAs-based material constituting the light-emitting element 1 is reflected by the reflective portion 210 toward the semiconductor layer and/or the substrate which are formed of a GaAs-based material.

Since the light-emitting element 1 in the first embodiment is provided with the reflective portion 210 as described above, the light emitted from the active layer 222 is reflected toward the light extracting surface by the reflective portion 210 even if the light is incident on the reflective portion 210 at various incident angles.

Buffer Layer 200 and Light Emitting Portion 20

The light emitting portion 20 has the first cladding layer 220, the active layer 222 and the second cladding layer 224. Firstly, the buffer layer 200 is formed in contact with the semiconductor substrate 10. The buffer layer 200 is formed on the semiconductor substrate 10, and can be formed of, e.g., a compound semiconductor which includes a carrier of a predetermined conductivity type and has a carrier concentration within a predetermined range. For example, when the semiconductor substrate 10 is formed of an n-type GaAs substrate, the buffer layer 200 is formed of n-type GaAs. In addition, the first cladding layer 220, the active layer 222 and the second cladding layer 224 are each formed of, e.g., a ternary or quaternary group III-V compound semiconductor material represented by $(Al_xGa_{1-x})_yIn_{1-y}P$ ($0 \leq x \leq 1$, $0 \leq y \leq 1$). Alternatively, the active layer 222 in the first embodiment can be formed of, e.g., an undoped $Ga_xIn_{1-x}P$ single layer ($0 \leq x \leq 1$).

Intermediate Layer 230

When a semiconductor material constituting the second cladding layer 224 and that constituting the current dispersion layer 240 are different from each other; the intermediate layer 230 is formed of a semiconductor material which reduces a potential barrier at a hetero-interface between the second cladding layer 224 and the current dispersion layer 240. In detail, the intermediate layer 230 is formed between the second cladding layer 224 and the current dispersion layer 240. In more detail, the intermediate layer 230 is formed on the second cladding layer 224 opposite to the active layer 222, and is formed of a semiconductor material having a bandgap energy between a bandgap energy of the semiconductor constituting the second cladding layer 224 and that of the semiconductor constituting the current dispersion layer 240. The intermediate layer 230 is formed of, e.g., p-type $Ga_zIn_{1-z}P$ (z is, e.g., $0.6 \leq z \leq 0.9$). It is possible to reduce forward voltage of a light-emitting device made from the light-emitting element 1 by providing the intermediate layer 230 in the light-emitting element 1.

Current Dispersion Layer 240

The current dispersion layer 240 is formed on the light emitting portion 20 opposite to the reflective portion 210, and disperses a current supplied to the light-emitting element 1 so that the current is substantially uniformly supplied to the active layer 222 in a planar direction. In addition, the current dispersion layer 240 is formed of a semiconductor material which transmits the light emitted from the active layer 222. The current dispersion layer 240 can be formed of, e.g., p-type GaP, p-type GaAsP or p-type AlGaAs. Furthermore, the current dispersion layer 240 has the concavo-convex portion 250 on the surface thereof. The thickness of the current dispersion layer 240 is not less than 2.0 μm and not more than 10.0 μm.

Concavo-Convex Portion 250

The concavo-convex portion 250 is formed on the surface of the current dispersion layer 240 in a region different from the region in which the front surface electrode 30 is provided. Then, the concavo-convex portion 250 is formed by roughening a surface of the current dispersion layer 240 opposite to the light emitting portion 20. The concavo-convex portion 250 is formed having a random shape by etching the surface using a predetermined etchant. Alternatively, the concavo-convex portion 250 can be formed having a predetermined pattern on the surface. Furthermore, in order to improve light extraction efficiency of a light-emitting device manufactured from the light-emitting element 1, the concavo-convex portion 250 preferably has arithmetic mean roughness Ra of not less than 0.04 μm and not more than 0.25 μm, root mean square roughness RMS of not less than 0.05 μm and not more than 0.35 μm and/or maximum height Ry of not less than 1.0 μm and not more than 3.0 μm.

Figure 1C:
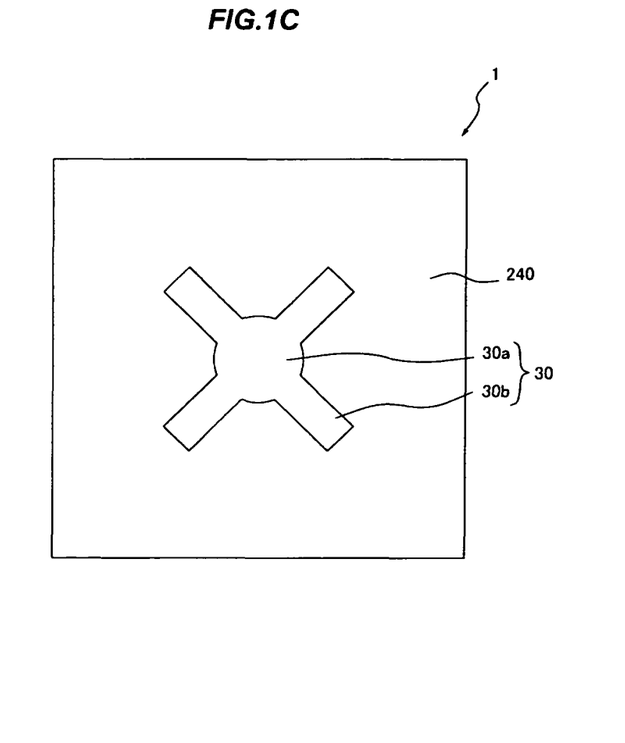
FIG. 1C is a schematic plan view showing the light-emitting element in the first embodiment of the invention.

FIG. 1C is a schematic plan view showing the light-emitting element in the first embodiment of the invention.

Front Surface Electrode 30 and Back Surface Electrode 35

The front surface electrode 30 is formed on the surface of the current dispersion layer 240 opposite to the light-emitting portion 20. In addition, the front surface electrode 30 is formed of a material in ohmic contact with the current dispersion layer 240. In detail, the front surface electrode 30 is formed including at least one metal material for a p-type electrode selected from metal materials such as Be, Zn, Ni, Ti, Pt, Al and Au. The front surface electrode 30 can be formed having, e.g., a laminated structure in which an AuBe layer (or an AuZn layer) as a first surface electrode layer, a Ni layer as a second surface electrode layer and an Au layer as a third surface electrode layer are laminated in this order from current dispersion layer 240 side. The front surface electrode 30 is formed on a surface of the current dispersion layer 240 opposite to the intermediate layer 230, i.e., on a portion of the light extracting surface of the light-emitting element 1.

Here, the thickness of the first surface electrode layer is preferably not less than 100 nm and not more than 600 nm. In addition, when the first surface electrode layer is formed of an AuBe alloy, a Be concentration is preferably not more than 1%. On the other hand, when the first surface electrode layer is formed of an AuZn alloy, a Zn concentration is preferably not less than 5% and not more than 15%.

In addition, when the light-emitting element 1 is viewed from then top, the front surface electrode 30 has a circular portion 30a having a substantially circular shape and four leg portions 30b extending from the circular portion 30a to four corners of the light-emitting element 1, as shown in FIG. 1C. Alternatively, the front surface electrode 30 can be formed into, e.g., a square, rhombic or polygonal shape, etc.

The back surface electrode 35 is formed of a material in ohmic contact with the semiconductor substrate 10. In detail, the back surface electrode 35 is formed including at least one metal material for an n-type electrode selected from metal materials such as Ge, Ni, Ti, Pt, Al and Au. The back surface electrode 35 can be formed having, e.g., a laminated structure in which AuGe, Ni and Au are laminated in this order from semiconductor substrate 10 side. The back surface electrode 35 is formed on the entire or substantially the entire back surface of the semiconductor substrate 10.

Method of Manufacturing the Light-Emitting Element 1

The light-emitting element 1 in the first embodiment can be manufactured, e.g., as follows. Firstly, the semiconductor substrate 10 is prepared. Here, the semiconductor substrate 10 can be formed by cutting out from a semiconductor ingot manufactured by a LEC method. In addition, the semiconductor substrate 10 can have a conductivity type of n-type by adding, e.g., Te to the semiconductor.

Then, a semiconductor laminated structure of group III-V compound semiconductor including plural compound semiconductor layers (i.e., the buffer layer 200, the reflective portion 210, the first cladding layer 220, the active layer 222, the second cladding layer 224, the intermediate layer 230 and the current dispersion layer 240) is formed on the semiconductor substrate 10 by, e.g., a Metal Organic Vapor Phase Epitaxy method (MOVPE method) (a growth step).

Here, formation of the semiconductor laminated structure using the MOVPE method is carried out by controlling a growth temperature, growth pressure, each growth rate of plural compound semiconductor layers included in the semiconductor laminated structure and a V/III ratio to values within respective predetermined ranges. The V/III ratio is a ratio of the molar number of a V group material such as arsine ($AsH_3$) or phosphine ($PH_3$) with reference to the molar number of a III group material such as trimethylgallium (TMGa) or trimethylaluminum (TMAl).

In addition, as for raw materials used in the MOVPE method, it is possible to use an organic metallic compound such as trimethylgallium (TMGa) or triethylgallium (TEGa) as a Ga raw material, trimethylaluminum (TMAl) as an Al raw material, and trimethylindium (TMIn) for an In raw material. In addition, it is possible to use a hydride gas such as arsine ($AsH_3$) for an As source, and phosphine ($PH_3$) for a P source, etc. In addition, hydrogen selenide ($H_2Se$) or disilane ($Si_2H_6$) can be used for a raw material of an n-type dopant. Meanwhile, bis-cyclopentadienyl magnesium ($Cp_2Mg$) can be used for a raw material of a p-type dopant.

Alternatively, monosilane ($SiH_4$), disilane ($Si_2H_6$), diethyl-tellurium (DETe) or dimethyl tellurium (DMTe) can be also used as a raw material of the n-type dopant. In addition, dimethyl zinc (DMZn) or diethyl zinc (DEZn) can be also used as a raw material of the p-type dopant, instead of using $Cp_2Mg$.

By forming the buffer layer 200 on the semiconductor substrate 10, it is possible to cancel influence of dopant used for the previous crystal growth (i.e., influence of furnace memory) which remains in a MOVPE apparatus. As a result, it is possible to stably manufacture an epitaxial wafer. In addition, by epitaxially growing the buffer layer 200 on the semiconductor substrate 10, it is possible to improve crystallizability of the compound semiconductor layer which is epitaxially grown on the buffer layer 200.

An epitaxial wafer for the light-emitting element 1 without the concavo-convex portion 250 is manufactured through each step described above.

Next, the epitaxial wafer is taken out from the MOVPE apparatus. Then, plural front surface electrode 30 are formed on a surface of the epitaxial wafer, i.e., on the surface of the current dispersion layer 240 by using a photolithography method and a film formation method (e.g., a vacuum deposition method or a sputtering method, etc.) so as to be arranged in a matrix shape (a front surface electrode formation step). Here, it is possible to use a lift-off method to form the front surface electrode 30.

Subsequently, the back surface electrode 35 is formed on substantially the entire back surface of the semiconductor substrate 10. Furthermore, in order to make ohmic contact between the front surface electrode 30 and the current dispersion layer 240 and between the back surface electrode 35 and the back surface of the semiconductor substrate 10, alloying treatment is carried out under a predetermined atmosphere (e.g., under an inert atmosphere such as a nitrogen atmosphere, etc.) at a predetermined temperature for predetermined time (an alloying step). As a result, an epitaxial wafer for LED is obtained.

Subsequently, the concavo-convex portion 250 is formed by performing concavo-convex treatment (i.e., roughening treatment) on the surface of the current dispersion layer 240 of the epitaxial wafer for LED (a concavo-convex portion formation step). The roughening treatment is performed on the surface of the current dispersion layer 240 excluding the region in which the front surface electrode 30 is provided. It is possible to use an erosion method for the roughening treatment. For example, when the current dispersion layer 240 is formed of GaP, etching using an acetic acid etchant can be performed. Alternatively, after forming a predetermined mask pattern on the surface of the current dispersion layer 240 using a photolithography method, etching treatment can be performed on the surface of the current dispersion layer 240 using the formed mask pattern as a mask.

Next, the epitaxial wafer provided with the concavo-convex portion 250 is cut in accordance with the size of the light-emitting element 1 to be manufactured, thereby manufacturing plural light-emitting elements 1 (a cutting step). In detail, a dicing device is used to dice each space between the plural front surface electrodes 30 in accordance with the size of the light-emitting element 1 to be manufactured. By performing etching treatment on edge faces of the plural light-emitting elements 1 after the dicing process, it is possible to remove mechanical damage caused by dicing.

The light-emitting element 1 thus manufactured is, e.g., a light-emitting diode which emits light with an emission peak wavelength of around 620 nm in a red region. Additionally, a shape of the light-emitting element 1 in a plan view is substantially rectangular, and a planar dimension thereof is, e.g., 275 µm square. Alternatively, the light-emitting element 1 can be further provided with a pad electrode as a wire bonding pad on the front surface electrode 30.

Modifications

As for compound semiconductor layers which are the semiconductor substrate 10, the buffer layer 200, the reflective portion 210, the first cladding layer 220, the second cladding layer 224, the intermediate layer 230 and the current dispersion layer 240 included in the light-emitting element 1, conductivity types of compound semiconductors constituting the compound semiconductor layers can be reversed from those in the first embodiment. For example, the conductivity type of the semiconductor substrate 10, the buffer layer 200, the reflective portion 210 and the first cladding layer 220 can be replaced with p-type while replacing the conductivity type of the second cladding layer 224, the intermediate layer 230 and the current dispersion layer 240 with n-type.

In addition, the active layer 222 can be formed having not a single layer structure but a quantum well structure. The quantum well structure can be any of a single quantum well structure, a multiple quantum well structure or a strained multiple quantum well structure. Alternatively, the light emitting portion 20 can be formed including a semiconductor layer other than the first cladding layer 220, the active layer 222 and the second cladding layer 224.

Meanwhile, the light-emitting element 1 in the first embodiment is a light-emitting element which emits light including red light (i.e., light with an emission wavelength of approximately 620 nm), however, the wavelength of the light emitted from the light-emitting element is not limited thereto as long as the reflective portion 210 is configured to reflect the second emission light from a GaAs-based material. Therefore, it is possible to form a light-emitting element emitting light within a predetermined wavelength by controlling the structure of the active layer 222. The light emitted from the active layer 222 includes, e.g., orange light, yellow light or green light, etc.

Then, thicknesses and materials of the first semiconductor layer 210a and the second semiconductor layer 210b which are included in the reflective portion 210 can be changed in accordance with the wavelength of the light emitted from the active layer 222. When the emission wavelength is, e.g., 570 nm (i.e., yellow-green light), $\theta$ in the formula (1) is set within a range from 56° to 61° for the first semiconductor layer 210a of the reflective portion 210, and $\theta$ in the formula (2) is set within a range from 56° to 61° for the second semiconductor layer 210b.

Meanwhile, $\theta$ is set within a range from 54° to 59° for the emission wavelength of 580 nm and within a range from 52° to 57° for the emission wavelength of 590 nm-band (i.e., yellow light) to determine the thicknesses of the first semiconductor layer 210a and the second semiconductor layer 210b which are included in the reflective portion 210.

Meanwhile, when the emission wavelength is in a range of 570 to 590 nm, the first semiconductor layer 210a and the second semiconductor layer 210b of the reflective portion 210 are formed of $Al_{0.6}Ga_{0.4}As$. This is because light with a wavelength of 570 to 590 nm is absorbed by the reflective portion 210 if the first semiconductor layer 210a and the second semiconductor layer 210b are formed of $Al_{0.5}Ga_{0.5}As$.

In addition, when the emission wavelength is not less than 600 nm, the second semiconductor layer 210b can be formed of $Al_{0.5}Ga_{0.5}As$. Then, when the emission wavelength is not less than 600 nm, the thickness of the first semiconductor layer 210a of the reflective portion 210 is determined by setting $\theta$ in the formula (1) within a range from 52° to 57° and the thickness of the second semiconductor layer 210b is determined by setting $\theta$ in the formula (2) within a range from 52° to 57°.

Furthermore, $\theta$ is set within a range from 50° to 55° for the emission wavelength of 610 nm, within a range from 47° to 52° for the emission wavelength of 630 nm, within a range from 46° to 51° for the emission wavelength of 640 nm and within a range from 44° to 49° for the emission wavelength of 650 nm to determine the thicknesses of the first semiconductor layer 210a and the second semiconductor layer 210b which are included in the reflective portion 210.

Effects of the First Embodiment

In the light-emitting element 1 in the first embodiment, the reflective portion 210 has a pair layer composed of the first semiconductor layer 210a and the second semiconductor layer 210b which reflect the second emission light (e.g., the light emitted from the semiconductor substrate 10 due to photoexcitation of a compound semiconductor constituting the semiconductor substrate 10 which is caused by the light emitted from the active layer 222), and it is thus possible to reduce the amount of the second emission light emitted to the outside of the light-emitting element 1.

In addition, the light-emitting element 1 in the first embodiment is provided with the reflective portion 210 having plural pair layers each composed of the first semiconductor layer 210a and the second semiconductor layer 210b of which thicknesses are controlled in accordance with plural incident angles, therefore, even if light is incident on the reflective portion 210 at various incident angles, the light can be reflected by the reflective portion 210 toward the light extracting surface. Furthermore, since the concavo-convex portion 250 is formed on the light extracting surface in the light-emitting element 1, the light reflected by the reflective portion 210 can be efficiently extracted from the light-emitting element 1. As a result, it is possible to provide the light-emitting element 1 in the first embodiment in which light extraction efficiency is improved.

Accordingly, in the light-emitting element 1 of the first embodiment, the reflective portion 210 has both the function of reflecting the light emitted from the active layer 222 and the function of reflecting the second emission light excited by the light emitted from the active layer 222, and it is thereby possible to suppress light having an unnecessary wavelength outwardly emitted from the light-emitting element 1. Furthermore, in the light-emitting element 1, it is not necessary to separately provide a semiconductor layer having the function of reflecting the second emission light, and it is thus possible to increase the light output without significantly increasing the manufacturing cost.

Second Embodiment

Figure 2:
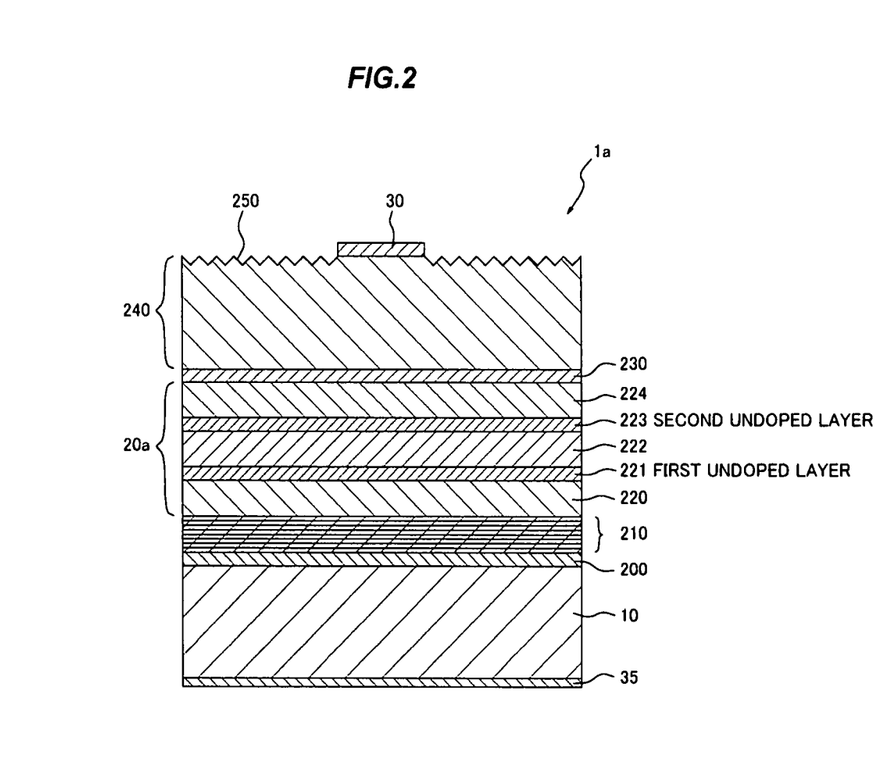
FIG. 2 is a schematic cross sectional view showing a light-emitting element in a second embodiment of the invention.

FIG. 2 is a schematic cross sectional view showing a light-emitting element in a second embodiment of the invention.

A light-emitting element 1a in the second embodiment has substantially the same structure as the light-emitting element 1 in the first embodiment, except that the active layer 222 is sandwiched between a first undoped layer 221 and a second undoped layer 223 unlike the light-emitting element 1 in the first embodiment. Therefore, a detailed explanation will be omitted except for differences.

In detail, the light-emitting element 1a in the second embodiment is provided with a semiconductor substrate 10, a buffer layer 200 formed on the semiconductor substrate 10, a reflective portion 210 formed on the buffer layer 200, a first cladding layer 220 formed on the reflective portion 210, a first undoped layer 221 formed on the first cladding layer 220, an active layer 222 formed on the first undoped layer 221, a second undoped layer 223 formed on the active layer 222, a second cladding layer 224 formed on the second undoped layer 223, an intermediate layer 230 formed on the second cladding layer 224, a current dispersion layer 240 formed on the intermediate layer 230, a concavo-convex portion 250 formed on a surface of the current dispersion layer 240, a front surface electrode 30 provided on a portion of the surface of the current dispersion layer 240, and a back surface electrode 35 provided on the entire or substantially the entire back surface of the semiconductor substrate 10.

The first undoped layer 221 suppresses dispersion of the n-type dopant contained in the first cladding layer 220 into the active layer 222. Meanwhile, the second undoped layer 223 suppresses dispersion of the p-type dopant contained in the second cladding layer 224 into the active layer 222. The first undoped layer 221 and the second undoped layer 223 are formed of, e.g., $(Al_xGa_{1-x})_yIn_{1-y}P$ not containing dopant. Since the dispersion of the dopants from the first cladding layer 220 and the second cladding layer 224 into the active layer 222 is suppressed by sandwiching the active layer 222 between the first undoped layer 221 and the second undoped layer 223, it is possible to improve the luminous efficiency in a light emitting portion 20a and to improve reliability of the light-emitting element 1a.

Although the light-emitting element 1a in the second embodiment is configured to sandwich the active layer 222 between the first undoped layer 221 and the second undoped layer 223, it is possible, in a modification of the second embodiment, to form a light-emitting element without providing any one of the first undoped layer 221 and the second undoped layer 223.

Third Embodiment

Figure 3:
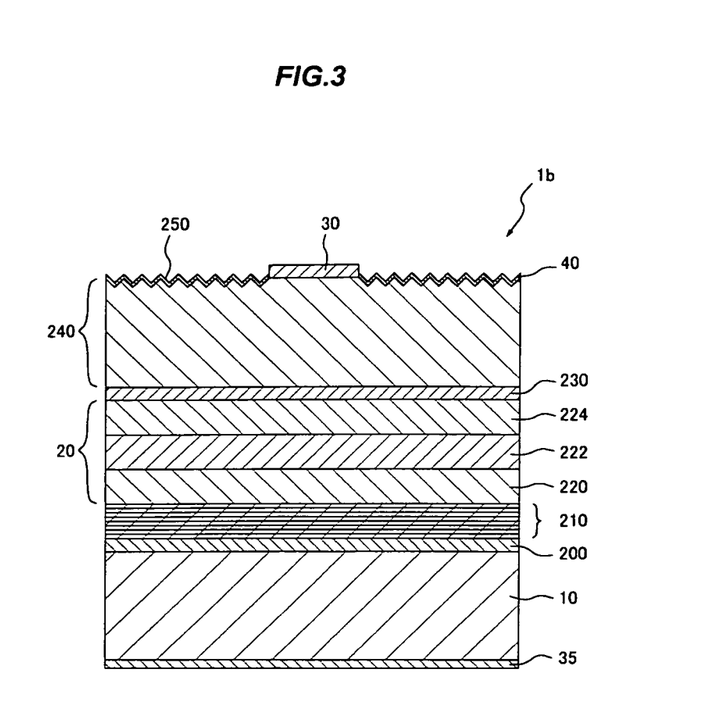
FIG. 3 is a schematic cross sectional view showing a light-emitting element in a third embodiment of the invention.

FIG. 3 is a schematic cross sectional view showing a light-emitting element in a third embodiment of the invention.

A light-emitting element 1b in the third embodiment has substantially the same structure as the light-emitting element 1 in the first embodiment, except that a light extracting layer 40 is further formed on the concavo-convex portion 250 unlike the light-emitting element 1 in the first embodiment. Therefore, a detailed explanation will be omitted except for differences.

The light-emitting element 1b includes a light extracting layer 40 which is formed on a surface of the current dispersion layer 240 excluding the region in which the front surface electrode 30 is provided. The light extracting layer 40 is formed of a material transparent to the light emitted from the active layer 222, and has a refractive index between a refractive index of a semiconductor constituting the current dispersion layer 240 and that of air. The light extracting layer 40 has a thickness d within a range of ±30% of a value defined by $A+\lambda_P/(4\times n)$ where a wavelength of the light emitted from the active layer 222 is defined as $\lambda_P$, a refractive index of a material constituting the light extracting layer 40 is defined as n, and A is a constant (A is an odd number).

The light extracting layer 40 can be formed of an insulator, an oxide of a first or second conductivity type or a nitride of a first or second conductivity type. The light extracting layer 40 can be formed of, e.g., an oxide such as $SiO_2$, $Sn_2O_3$, $TiO_2$ or ITO, or a nitride such as SiN. In addition, a material constituting the light extracting layer 40 does not need to have conductivity. Furthermore, a conductivity type of the material constituting the light extracting layer 40 may be either p-type or n-type.

Since, in the light-emitting element 1b, the light extracting layer 40 having a refractive index between the refractive index of the material constituting the current dispersion layer 240 and that of the air is formed between the current dispersion layer 240 and the external air, it is possible to further improve the light extraction efficiency.

Fourth Embodiment

Figure 4:
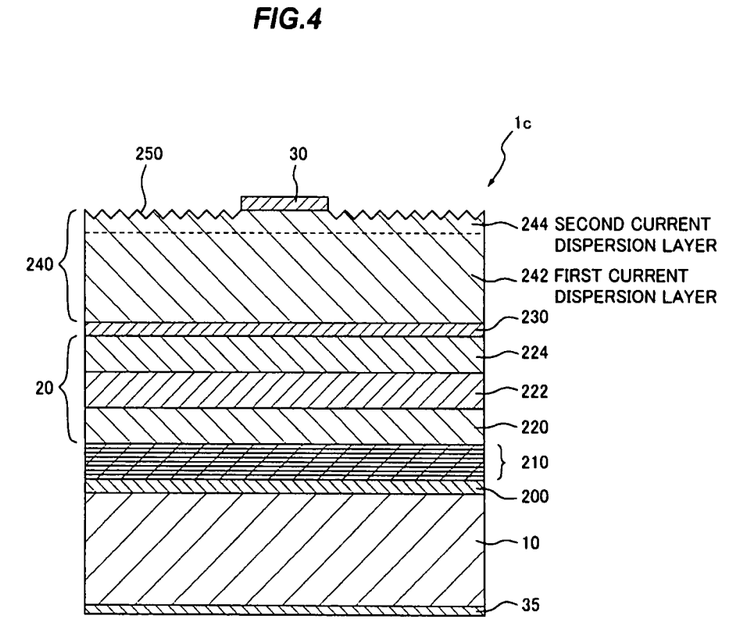
FIG. 4 is a schematic cross sectional view showing a light-emitting element in a fourth embodiment of the invention.

FIG. 4 is a schematic cross sectional view showing a light-emitting element in a fourth embodiment of the invention.

A light-emitting element 1c in the fourth embodiment has substantially the same structure as the light-emitting element 1 in the first embodiment, except that the current dispersion layer 240 has plural current dispersion layers unlike the light-emitting element 1 in the first embodiment. Therefore, a detailed explanation will be omitted except for differences.

The current dispersion layer 240 included in the light-emitting element 1c in the fourth embodiment has a first current dispersion layer 242 and a second current dispersion layer 244 which have carrier concentrations and/or impurity concentrations different from each other. The second current dispersion layer 244 is formed on a side further than the first current dispersion layer 242 from the semiconductor substrate 10, and has the concavo-convex portion 250 on a surface thereof (i.e., on the light extracting surface). In other words, the second current dispersion layer 244 is the outermost layer of the current dispersion layer 240.

In the fourth embodiment, the second current dispersion layer 244 is formed at a position further than the first current dispersion layer 242 from the semiconductor substrate 10, and has a higher carrier concentration or impurity concentration than that of the first current dispersion layer 242. In detail, on a principal surface side (i.e., the front surface) of the light-emitting element 1, the second current dispersion layer 244 is formed in a region of the current dispersion layer 240 in which an impurity concentration determining a carrier concentration and/or a conductivity type is the highest.

In addition, it is preferable that the second current dispersion layer 244 (hereinafter also referred to as "an outermost current dispersion layer") have a thickness of not less than 1.0 μm and not more than 3.0 μm in a range not exceeding the thickness of the current dispersion layer 240. In addition, the impurity concentration of the outermost current dispersion layer is preferably set to the highest among the current dispersion layers of the current dispersion layer 240.

A light-emitting element, which corresponds to the light-emitting element 1 in the first embodiment and emits orange light with an emission peak wavelength around 620 nm, was made as a light-emitting element of Example 1. In addition, a light-emitting element in which only a structure of the reflective portion 210 is different from Example 1 was also made as a light-emitting element of Comparative Example.

In detail, firstly, a buffer layer formed of n-type GaAs (doped with Se, carrier concentration of $1\times10^{18}/cm^3$ and film thickness of 200 nm) and a reflective portion 210 including 50 pair layers each composed of an AlAs layer as the first semiconductor layer 210a and an $Al_{0.5}Ga_{0.5}As$ layer as the second semiconductor layer 210b were epitaxially grown on an n-type GaAs substrate as the semiconductor substrate 10 having an off-angle of 15° using the MOVPE method. The carrier concentration of each semiconductor layer constituting the reflective portion 210 was controlled to about $1\times10^{18}/cm^3$.

Furthermore, an n-type $(Al_{0.7}Ga_{0.3})_{0.5}In_{0.5}P$ cladding layer as the first cladding layer 220 (doped with Se, carrier concentration of $4\times10^{17}/cm^3$ and film thickness of 400 nm), an undoped multiple quantum well layer as the active layer 222 (film thickness of about 400 nm), a p-type $(Al_{0.7}Ga_{0.3})_{0.5}In_{0.5}P$ cladding layer as the second cladding layer 224 (doped with Mg, carrier concentration of $2\times10^{17}/cm^3$ and film thickness of 500 nm), a p-type $Ga_{0.7}In_{0.3}P$ intermediate layer as the intermediate layer 230 (doped with Mg, carrier concentration of $6\times10^{18}/cm^3$ and film thickness of 20 nm) and a p-type GaP current dispersion layer as the current dispersion layer 240 (doped with Mg, carrier concentration of $2\times10^{18}/cm^3$ and film thickness of 8000 nm) were sequentially epitaxially grown on the reflective portion 210.

The growth temperature by the MOVPE growth was set to 650° C. from the growth of the buffer layer formed of n-type GaAs to the growth of the p-type $Ga_{0.7}In_{0.3}P$ intermediate layer, and was set to 675° C. for the growth of the p-type GaP current dispersion layer. In addition, as for the other growth conditions, growth pressure was set to 6666.1 Pa (50 Torr) and each growth rate of plural compound semiconductor layers was set to 0.3 to 1.5 nm/sec. In addition, a V/III ratio was set to about 150. In this regard, however, the V/III ratio for growing the p-type GaP current dispersion layer was set to 25. Since the raw materials, etc., used for the MOVPE growth has been explained in the first embodiment, the detail explanation is omitted.

Meanwhile, when the emission wavelength $\lambda_P$ is 620 nm, an undoped multiple quantum well layer having 20 to 40 pairs each composed of a GaInP layer as a well layer (e.g., having a thickness of 4 nm) and an $Al_{0.5}Ga_{0.5}InP$ layer as a barrier layer (e.g., having a thickness of 7.5 nm) can be used as the active layer 222. Here, it is possible to adjust the emission wavelength to, e.g., 570 nm or 590 nm by fixing the thickness of the well layer to 3.5 nm and the barrier layer to 7.5 nm and changing the Al composition of the well layer (the adjustment is carried out on 20 to 80 pairs).

Here, the reflective portion 210 will be explained in detail. Thicknesses of the AlAs layer as the first semiconductor layer 210a and the $Al_{0.5}Ga_{0.5}As$ layer as the second semiconductor layer 210b in the plural pair layers of the reflective portion 210 were respectively controlled to thicknesses calculated by the formulas (1) and (2). In other words, the emission peak wavelength "620 nm" of the light emitted from the active layer 222 was used as $\lambda_P$, the refractive index of the AlAs layer "3.125" was used as $n_A$, the refractive index of the $Al_{0.5}Ga_{0.5}As$ layer "3.536" was used as $n_A$, and the refractive index of the n-type $(Al_{0.7}Ga_{0.3})_{0.5}In_{0.5}P$ cladding layer "3.127" was used as $n_{In}$. Furthermore, 0° to 70° were used as the angle θ in the formulas (1) and (2). Note that, the value of θ for the AlAs layer and the $Al_{0.5}Ga_{0.5}As$ layer which compose one pair layer is the same in this case.

A thickness of one pair layer included in the reflective portion 210 is determined by the formulas (1) and (2) and is thus different depending on the value of θ. In Example 1, the reflective portion 210 includes at least one pair of the first semiconductor layer 210a and the second semiconductor layer 210b for which θ is set to 70°. In addition, the reflective portion 210 includes the first semiconductor layers 210a and the second semiconductor layers 210b for which θ is set to at least two values which are not 70°. In detail, the first semiconductor layers 210a and the second semiconductor layers 210b for which the value of θ is set to 10° and 40° are included.

Therefore, in Example 1, the reflective portion 210 has a first pair layer composed of the first semiconductor layer 210a and the second semiconductor layer 210b for which θ in the formulas (1) and (2) is set to 10°, a second pair layer composed of the first semiconductor layer 210a and the second semiconductor layer 210b for which θ is set to 40° and a third pair layer composed of the first semiconductor layer 210a and the second semiconductor layer 210b for which θ is set to 70°.

In addition, the reflective portion 210 was formed having a total thickness of about 6.0 μm. In detail, the value of θ in the formulas (1) and (2) was varied to determine the thickness of the first semiconductor layer 210a, that of the second semiconductor layer 210b and the number of pair layers so that the total thickness of the reflective portion 210 is about 6.0 μm.

Furthermore, in Example 1, the reflective portion 210 has both a function of reflecting the first emission light with an emission peak wavelength of 620 nm toward the current dispersion layer 240 and a function of reflecting the second emission light (light of about 870 nm) generated at the semiconductor substrate 10 and the buffer layer 200 due to the first emission light toward the semiconductor substrate 10.

Alternatively, the light-emitting element 1 can be further provided with a second reflective portion which is formed between the reflective portion 210 and the semiconductor substrate 10. That is, a second reflective portion having plural pair layers each composed of a third semiconductor layer and a fourth semiconductor layer different from the third semiconductor layer can be formed between the reflective portion 210 and the semiconductor substrate 10. It is possible to further reduce the second emission light by providing the second reflective portion.

In this case, the third semiconductor layer is formed having a thickness $T_C$ defined by the formula (3) where $\mu_{P2}$ is 870±30 nm and a refractive index of the third semiconductor layer is defined as $n_C$. Meanwhile, the fourth semiconductor layer is formed having a thickness $T_D$ defined by the formula (4) where a refractive index of the fourth semiconductor layer is defined as $n_D$. The third and fourth semiconductor layers can be formed of $Al_xGa_{1-x}As$ (0≤x≤1) having refractive indexes different from each other or $(Al_yGa_{1-y})_zIn_{1-z}P$ (0≤y≤1 and 0.4≤z≤0.6) having refractive indexes different from each other. It is possible to form, e.g., the third semiconductor layer from AlAs and the fourth semiconductor layer from $Al_{0.5}Ga_{0.5}As$.

$$T_C = \frac{\lambda_{p2}}{4n_C} \qquad \text{Formula (3)}$$

$$T_D = \frac{\lambda_{p2}}{4n_D} \qquad \text{Formula (4)}$$

Here, when the peak wavelength of the second emission light is 870 nm, the film thickness of the third semiconductor layer is $870/4n_C$ ($n_C$=2.9806), hence, 73.0 nm. Meanwhile, the film thickness of the fourth semiconductor layer is $870/4n_D$ ($n_D$=3.2553), hence, 66.8 nm. Therefore, in order to reflect the second emission light with a peak wavelength of 870 nm by the reflective portion 210, the reflective portion 210 is required to have a 73.0 nm-thick third semiconductor layer and a 66.8 nm-thick fourth semiconductor layer (the total thickness of the third and fourth semiconductor layers is 139.8 nm).

Then, among the light generated at the active layer 222, the light incident on the reflective portion 210 at a predetermined angle is reflected toward the light extracting surface and is thereby emitted to the outside of the light-emitting element 1 from the surface of the current dispersion layer 240. Meanwhile, the second emission light generated by photoexcitation of the semiconductor substrate 10 and the buffer layer 200 caused by light transmitted without being reflected by the reflective portion 210 is reflected by the reflective portion 210 toward the semiconductor substrate 10 and is converted into heat over time.

Since the half-value width of the second emission light which is generated at semiconductor substrate 10 and the buffer layer 200 due to the first emission light is large, the second emission light includes light with a wavelength in a range of 840 to 900 nm. Therefore, the reflective portion 210 preferably has a function of reflecting the light with a wavelength in a range of 840 to 900 nm. Thus, in Example 1, in order to reflect light with a wavelength of 840 to 900 nm by the reflective portion 210, the reflective portion 210 was formed having the first semiconductor layers 210a and the second semiconductor layers 210b with film thicknesses defined by the formulas (1) and (2) for which the value of θ is set to 49°, 50°, 51°, 52°, 53° and 54°.

Table 1 shows a specific configuration of the reflective portion 210. Table 1 also shows a configuration of a reflective portion in Comparative Example.

TABLE 1

| | Example | | | | | Comparative Example | | | |
|---|---|---|---|---|---|---|---|---|---|
| Angle | Film thickness (nm) | | | Number | Angle | Film thickness (nm) | | | Number |
| (°) | $Al_{0.5}Ga_{0.5}As$ | AlAs | AlAs + AlGaAs | of pairs | (°) | $Al_{0.5}Ga_{0.5}As$ | AlAs | AlAs + AlGaAs | of pairs |
| 0 | 43.8 | 49.6 | 93.4 | 2 | 0 | 43.8 | 49.6 | 93.4 | 3 |
| 10 | 44.4 | 50.4 | 94.8 | 9 | 10 | 44.4 | 50.4 | 94.8 | 9 |
| 20 | 46.0 | 52.8 | 98.8 | 9 | 20 | 46.0 | 52.8 | 98.8 | 9 |
| 30 | 48.9 | 57.3 | 106.2 | 8 | 30 | 48.9 | 57.3 | 106.2 | 8 |
| 40 | 53.3 | 64.8 | 118.1 | 8 | 40 | 53.3 | 64.8 | 118.1 | 8 |
| 49 | 58.9 | 75.7 | 134.6 | 1 | 50 | 59.6 | 77.2 | 136.8 | 5 |
| 50 | 59.6 | 77.2 | 136.8 | 1 | — | — | — | — | — |
| 51 | 60.3 | 78.9 | 139.2 | 2 | — | — | — | — | — |
| 52 | 61.1 | 80.0 | 141.1 | 2 | — | — | — | — | — |
| 53 | 61.9 | 82.5 | 144.4 | 1 | — | — | — | — | — |
| 54 | 62.7 | 84.5 | 147.2 | 1 | — | — | — | — | — |
| 60 | 68.2 | 99.4 | 167.6 | 4 | 60 | 68.2 | 99.4 | 167.6 | 5 |
| 70 | 78.8 | 145.7 | 224.5 | 2 | 70 | 78.8 | 145.7 | 224.5 | 3 |
| Total thickness (nm) | | | 5967.5 | 50 | Total thickness (nm) | | | 6013.4 | 50 |

As shown in Table 1, a structure of the reflective portion 210 of the light-emitting element in Example 1 is as follows. That is, firstly, two pair layers each composed of an AlAs layer and an $Al_{0.5}Ga_{0.5}As$ layer having thicknesses calculated by the formulas (1) and (2) with θ set to 70° (hereinafter referred to as "a 70° DBR layer") were formed on an n-type GaAs buffer layer. Next, four pair layers each composed of an AlAs layer and an $Al_{0.5}Ga_{0.5}As$ layer having thicknesses calculated by the formulas (1) and (2) with θ set to 60° (hereinafter referred to as "a 60° DBR layer") were formed on the 70° DBR layer. Then, one pair layer composed of an AlAs layer and an $Al_{0.5}Ga_{0.5}As$ layer having thicknesses calculated by the formulas (1) and (2) with θ set to 54° (hereinafter referred to as "a 54° DBR layer") was formed on the 60° DBR layer.

Furthermore, one pair layer composed of an AlAs layer and an $Al_{0.5}Ga_{0.5}As$ layer having thicknesses calculated by the formulas (1) and (2) with θ set to 53° (hereinafter referred to as "a 53° DBR layer") was formed on the 54° DBR layer. Then, two pair layers each composed of an AlAs layer and an $Al_{0.5}Ga_{0.5}As$ layer having thicknesses calculated by the formulas (1) and (2) with θ set to 52° (hereinafter referred to as "a 52° DBR layer") were formed on the 53° DBR layer.

Furthermore, two pair layers each composed of an AlAs layer and an $Al_{0.5}Ga_{0.5}As$ layer having thicknesses calculated by the formulas (1) and (2) with θ set to 5.1° (hereinafter referred to as "a 51° DBR layer") were formed on the 52° DBR layer. Then, one pair layer composed of an AlAs layer and an $Al_{0.5}Ga_{0.5}As$ layer having thicknesses calculated by the formulas (1) and (2) with θ set to 50° (hereinafter referred to as "a 50° DBR layer") was formed on the 51° DBR layer.

Furthermore, one pair layer composed of an AlAs layer and an $Al_{0.5}Ga_{0.5}As$ layer having a thickness calculated by the formulas (1) and (2) with θ set to 49° (hereinafter referred to as "a 49° DBR layer") was formed on the 50° DBR layer. Then, eight pair layers each composed of an AlAs layer and an $Al_{0.5}Ga_{0.5}As$ layer having thicknesses calculated by the formulas (1) and (2) with θ set to 40° (hereinafter referred to as "a 40° DBR layer") were formed on the 49° DBR layer.

Furthermore, eight pair layers each composed of an AlAs layer and an $Al_{0.5}Ga_{0.5}As$ layer having thicknesses calculated by the formulas (1) and (2) with θ set to 30° (hereinafter referred to as "a 30° DBR layer") were formed on the 40° DBR layer. Then, nine pair layers each composed of an AlAs layer and an $Al_{0.5}Ga_{0.5}As$ layer having thicknesses calculated by the formulas (1) and (2) with θ set to 20° (hereinafter referred to as "a 20° DBR layer") were formed on the 30° DBR layer.

Furthermore, nine pair layers each composed of an AlAs layer and an $Al_{0.5}Ga_{0.5}As$ layer having thicknesses calculated by the formulas (1) and (2) with θ set to 10° (hereinafter referred to as "a 10° DBR layer") were formed on the 20° DBR layer. Then, two pair layers each composed of an AlAs layer and an $Al_{0.5}Ga_{0.5}As$ layer having thicknesses calculated by the formulas (1) and (2) with θ set to 0° (hereinafter referred to as "a 0° DBR layer") were formed on the 10° DBR layer. The reflective portion 210 having such 50 pair layers was formed on the n-type GaAs buffer layer.

Plural epitaxial wafers in Example 1 were made as described above. Then, an epitaxial wafer in Comparative Example which includes a reflective portion shown in Table 1 was also made in the same manner.

The front surface electrodes 30 having a circular portion with a diameter of 100 μm and four leg portions extending from an outer edge of the circular portion were formed and arranged in a matrix shape on the surfaces of the plural epitaxial wafers in Example 1 and the epitaxial wafer in Comparative Example which were made as described above. A photolithography method was used for forming the front surface electrode 30.

In other words, after applying photoresist on the surface of the epitaxial wafer, a mask pattern having openings in each region for forming plural front surface electrodes 30 was formed on the surface of the epitaxial wafer by the photolithography method using a mask aligner. After that, an AuBe alloy (400 nm in thickness), Ni (10 nm in thickness) and Au (1000 nm in thickness) were deposited in this order in the openings using the vacuum deposition method. After depositing each metal, the mask pattern formed on the epitaxial wafer was removed by the lift-off method, which results in that the front surface electrodes 30 were formed on the surface of the epitaxial wafer.

Next, the back surface electrode 35 was formed on a back surface of the epitaxial wafer, i.e., the entire surface opposite to the surface in which the front surface electrode 30 is formed, using the vacuum deposition method. The back surface electrode 35 was formed by depositing 60 nm-thick AuGe, 10 nm-thick Ni and 500 nm-thick Au in this order. After forming the front surface electrode 30 and the back surface electrode 35, an alloying step for alloying the electrodes was carried out. In detail, the epitaxial wafer having the front surface electrode 30 and the back surface electrode 35 formed thereon was heated in a nitrogen gas atmosphere at 400° C. for 5 minutes.

As a result, the plural epitaxial wafer for LED in Example 1 and the epitaxial wafer for LED in Comparative Example were made.

Next, the roughening treatment of each epitaxial wafer for LED in Example 1 and Comparative Example was performed on the surface of the current dispersion layer 240 excluding the region in which the front surface electrode 30 is formed. In detail, the roughening treatment was performed on the surface of the current dispersion layer 240 for 30 seconds using an acetic acid etchant.

Figure 5:
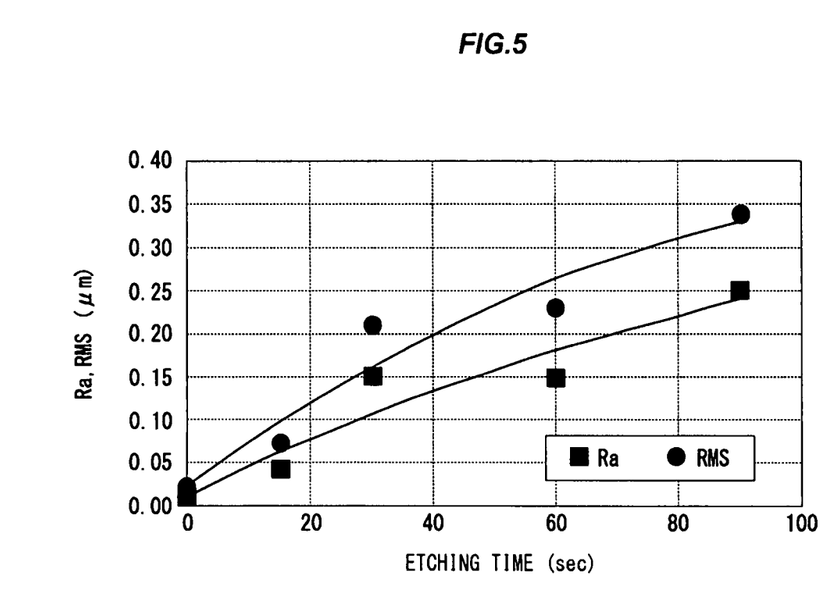
FIG. 5 is a diagram illustrating a relation of etching time, mean roughness and root mean square roughness.

Some of the plural epitaxial wafers for LED in Example 1 were used to examine a relation between etching time and unevenness on the surface of the current dispersion layer 240.

FIG. 5 is a diagram illustrating a relation of etching time, mean roughness and root mean square roughness.

In detail, etching time was set to 15 seconds, 30 seconds, 60 seconds and 90 seconds, and a relation between etching time and unevenness was each examined. The results were that Ra (mean roughness) was 0.04 to 0.25 μm, RMS (root mean square roughness) was 0.05 to 0.35 μm and Ry (maximum height) was 1.4 to 2.6 μm.

Following this, the epitaxial wafers for LED in Example 1 and in Comparative Example in which the roughening treatment was performed on the surface of the current dispersion layer 240 for 30 seconds were each cut using a dicing device so that the front surface electrode 30 is located at the center.

Thus, a LED bare chip in Example 1 and a LED bare chip in Comparative Example were made. The chip size is 275 μm square for each.

Next, each of the manufactured LED bare chips (a LED bare chip taken from around the center of the wafer) was die-bonded to a TO-18 stem using Ag paste. Then, the front surface electrode 30 of the LED bare chip mounted on the TO-18 stem was wire-bonded using a wire formed of Au, thereby respectively making the light-emitting elements in Example 1 and Comparative Example.

The initial characteristics of the light-emitting elements in Example 1 and Comparative Example which were made as described above were evaluated. The results were that the light output of the light-emitting element in Example 1 was 3.67 mW and that of the light-emitting element in Comparative Example was 3.63 mW. Meanwhile, the emission peak wavelength of the light-emitting element in Example 1 was 620 nm and that of the light-emitting element in Comparative Example was 621 nm. In addition, forward voltage (Vf) of the light-emitting element in Example 1 and that of the light-emitting element in Comparative Example were both 1.92V. Note that, the electric current during the evaluation was 20 mA.

On the other hand, a light intensity ratio of the second emission light to the first emission light of the light-emitting element in Comparative Example (i.e., calculated by "second emission light/first emission light×100") was 0.30% while it was 0.01% for the light-emitting element in Example 1.

In addition, a power-on test was conducted for 168 hours at room temperature at electric current of 50 mA. The result was that a relative output of the light-emitting element in Example 1 was 96 to 105%, which was a characteristic equivalent to that of the light-emitting element in Comparative Example. Here, the relative output was calculated by "light output after 168 hours of electrification/initial light output×100". The electric current during the evaluation was set to 20 mA both before and after applying 50 mA of current.

Also, light-emitting elements were made from epitaxial wafers for LED in which etching time performed on the surface of the current dispersion layer 240 is 15 seconds, 60 seconds and 90 seconds excluding 30 seconds. Then, characteristics of each light-emitting element were verified and it was confirmed that the characteristics thereof were equivalent to those of the light-emitting element in Example 1 which was made by etching for 30 seconds (i.e., the value of each characteristic falls within each range ±3%).

Although the embodiments and example of the invention have been described, the invention according to claims is not to be limited to the above-mentioned embodiments and example. Further, please note that all of the combinations of the features described in the above embodiments and examples are not needed to solve the problem of the invention.

What is claimed is:

1. A light-emitting element, comprising:
a semiconductor substrate;
a light emitting portion comprising an active layer sandwiched between a first cladding layer of a first conductivity type and a second cladding layer of a second conductivity type different from the first conductivity type;
a first reflective portion between the semiconductor substrate and the light emitting portion for reflecting light emitted from the active layer, the first reflective portion comprising a plurality of pair layers each including a first semiconductor layer and a second semiconductor layer different from the first semiconductor layer;
a current dispersion layer on an opposite side of the light emitting portion from the first reflective portion;
an intermediate layer between the second cladding layer and the current dispersion layer, the intermediate layer comprising a semiconductor having a bandgap energy between a bandgap energy of a semiconductor comprising the second cladding layer and a bandgap energy of a semiconductor comprising the current dispersion layer; and
a second reflective portion between the first reflective portion and the semiconductor substrate, the second reflective portion comprising a plurality of pair layers each including a third semiconductor layer and a fourth semiconductor layer different from the third semiconductor layer,
wherein the first semiconductor layer has a thickness $T_{A1}$ defined by a formula (1) and the second semiconductor layer has a thickness $T_{B1}$ defined by a formula (2), where $\lambda_P$ represents a peak wavelength of the light emitted from the active layer, $n_A$ represents a refractive index of the first semiconductor layer, $n_B$ represents a refractive index of the second semiconductor layer, $n_{Im}$ represents a refractive index of the first cladding layer, where a principal surface of the second semiconductor layer is the incident plane of light
wherein the plurality of pair layers of the first reflective portion each comprise the first semiconductor layer and the second semiconductor layer with the thickness defined by the formula (1) and the formula (2), respectively, with limiting θ in a range of not less than 44 degrees and not more than 61 degrees,
wherein a value of θ is different from each other among the plurality of pair layers of the first reflective portion, $$T_{A1} = \frac{\lambda_p}{4n_A\sqrt{1-\left(\frac{n_{In}\sin\theta}{n_A}\right)^2}} \quad \text{Formula (1)}$$

$$T_{B1} = \frac{\lambda_p}{4n_B\sqrt{1-\left(\frac{n_{In}\sin\theta}{n_B}\right)^2}} \quad \text{Formula (2)}$$

wherein the plurality of pair layers of the first reflective portion each comprise the first semiconductor layer having the thickness $T_{A1}$ that is not less than 1.5 times of $\lambda_P/4n_A$ and the second semiconductor layer having the thickness $T_{B1}$ that is not less than 1.5 times of $\lambda_P/4n_B$, wherein the third semiconductor layer has a thickness $T_C$ defined by a formula (3) where $\lambda_{P2}$ is 870±30 nm and $n_C$ represents a refractive index of the third semiconductor layer, and wherein the fourth semiconductor layer has a thickness $T_D$ defined by a formula (4) where $n_D$ represents a refractive index of the fourth semiconductor layer $$T_C = \frac{\lambda_{p2}}{4n_C} \quad \text{Formula (3)}$$

$$T_D = \frac{\lambda_{p2}}{4n_D}. \quad \text{Formula (4)}$$

2. The light-emitting element according to claim 1, wherein the first reflective portion and the second reflective portion have a bandgap more than that of a semiconductor including the active layer and comprises $Al_xGa_{1-x}As$ (0≤x≤1) that is transparent to light emitted from the active layer.

3. The light-emitting element according to claim 2, wherein the first semiconductor layer and the second semiconductor layer comprise $Al_xGa_{1-x}As$ (0≤x≤1) having a refractive index different from each other or $(Al_yGa_{1-y})_zIn_{1-z}P$ (0≤y≤1 and 0.4≤z≤0.6) having a refractive index different from each other, and wherein the third semiconductor layer and the fourth semiconductor layer comprise $Al_xGa_{1-x}As$ (0≤x≤1) having a refractive index different from each other or $(Al_yGa_{1-y})_zIn_{1-z}P$ (0≤y≤1 and 0.4≤z≤0.6) having a refractive index different from each other.

4. The light-emitting element according to claim 3, wherein the current dispersion layer comprises a plurality of current dispersion layers, and wherein a current dispersion layer of the plurality of current dispersion layers on an opposite side from the semiconductor substrate has a highest impurity concentration determining a carrier concentration and a conductivity type.

5. The light-emitting element according to claim 4, further comprising:

a front surface electrode on a surface of the current dispersion layer on an opposite side from the light emitting portion;

a concavo-convex portion formed in a region on the surface of the current dispersion layer except a region on which the front surface electrode is formed; and a light extracting layer formed on a surface of the concavo-convex portion, being transparent to the light emitted from the active layer and comprising a material having a refractive index between a refractive index of a semiconductor composing the current dispersion layer and that of air.

6. The light-emitting element according to claim 5, wherein the light extracting layer has a thickness d within a range of ±30% of a value defined by $A+\lambda_P/(4\times n)$ where $\lambda_P$ represents a wavelength of the light emitted from the active layer, n represents a refractive index of a material constituting the light extracting layer, and A is a constant and an odd number.

7. The light-emitting element according to claim 6, wherein the light electrically conductive oxide of the first or second conductivity type, or a nitride.

8. The light-emitting element according to claim 1, wherein the first reflective portion comprises $(Al_yGa_{1-y})_zIn_{1-z}P$ (0≤y≤1 and 0.4≤z≤0.6).

9. The light-emitting element according to claim 8, wherein the second reflective portion comprises $(Al_yGa_{1-y})_zIn_{1-z}P$ (0≤y≤1 and 0.4≤z≤0.6).

10. The light-emitting element according to claim 9, wherein the semiconductor substrate comprises an n-type GaAs.

11. The light-emitting element according to claim 10, further comprising a buffer layer between the semiconductor substrate and the second reflective portion, wherein the buffer layer comprises an n-type GaAs.

12. The light-emitting element according to claim 11, wherein the first cladding layer, the active layer, and the second cladding layer each comprise a ternary or a quaternary group III-V compound semiconductor material represented by $(Al_xGa_{1-x})_yIn_{1-y}P$ (0≤x≤1, 0≤y≤1).

13. The light-emitting element according to claim 11, wherein the active layer comprises an undoped $Ga_xIn_{1-x}P$ single layer (0≤x≤1).

14. The light-emitting element according to claim 1, further comprising a buffer layer between the semiconductor substrate and the second reflective portion, wherein the buffer layer comprises an n-type GaAs.

15. The light-emitting element according to claim 14, wherein the first cladding layer, the active layer, and the second cladding layer each comprise a ternary or a quaternary group III-V compound semiconductor material represented by $(Al_xGa_{1-x})_yIn_{1-y}P$ (0≤x≤1, 0≤y≤1).

16. The light-emitting element according to claim 1, wherein the active layer comprises an undoped $Ga_xIn_{1-x}P$ single layer (0≤x≤1).

17. The light-emitting element according to claim 1, wherein the semiconductor substrate comprises an n-type GaAs.

\* \* \* \* \*